US010060978B2

(12) United States Patent
Douskey et al.

(10) Patent No.: US 10,060,978 B2
(45) Date of Patent: Aug. 28, 2018

(54) IMPLEMENTING PRIORITIZED COMPRESSED FAILURE DEFECTS FOR EFFICIENT SCAN DIAGNOSTICS

(71) Applicant: International Business Machines Corporation, Armonk, NY (US)

(72) Inventors: Steven M. Douskey, Rochester, MN (US); Michael J. Hamilton, Rochester, MN (US); Amanda R. Kaufer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 15/188,593

(22) Filed: Jun. 21, 2016

(65) Prior Publication Data
US 2017/0363685 A1   Dec. 21, 2017

(51) Int. Cl.
*G01R 31/3177*   (2006.01)
*G01R 31/317*   (2006.01)

(52) U.S. Cl.
CPC ... *G01R 31/3177* (2013.01); *G01R 31/31723* (2013.01)

(58) Field of Classification Search
CPC .......... G01R 31/3177; G01R 31/31723; G01R 31/318533; G01R 31/318536; G01R 31/318544; G01R 31/318583
See application file for complete search history.

(56) References Cited

U.S. PATENT DOCUMENTS

| 7,412,672 | B1* | 8/2008 | Wang ................. G01R 31/3177 716/106 |
| 7,437,640 | B2 | 10/2008 | Rajski et al. |
| 7,509,550 | B2 | 3/2009 | Rajski et al. |
| 9,092,333 | B2 | 7/2015 | Phan et al. |
| 9,110,135 | B2 | 8/2015 | Douskey et al. |
| 9,151,800 | B2 | 10/2015 | Douskey et al. |
| 9,702,934 | B1* | 7/2017 | Meehl ............ G01B 31/318335 |
| 9,778,316 | B2* | 10/2017 | Rajski ................ G01R 31/3177 |
| 2002/0152060 | A1* | 10/2002 | Tseng ..................... G06F 13/22 703/17 |

(Continued)

FOREIGN PATENT DOCUMENTS

CN    101753382 A    6/2010

OTHER PUBLICATIONS

Li, R. et al.; "Fault diagnosis layer model of distribution network based on weighted mean roughness"; Power System Technology, vol. 30, No. 2, pp. 61-65; Jan. 2006.

(Continued)

*Primary Examiner* — Cynthia Britt
(74) *Attorney, Agent, or Firm* — Joan Pennington

(57) ABSTRACT

A method and circuits are provided for implementing enhanced scan data testing using an XOR network to prioritize faults to be simulated during diagnostic isolation, and reducing the number of faults requiring re-simulation. A test is run, scan data are applied to scan channels using the XOR network and the output scan data are unloaded. A list of possible faults is identified based on pin flips, and the possible faults to be simulated during diagnostic isolation are prioritized by a number of occurrences in the list, and possible faults are further graded to reduce the number of possible faults requiring re-simulation.

20 Claims, 15 Drawing Sheets

(56) References Cited

U.S. PATENT DOCUMENTS

2004/0230884 A1* 11/2004 Rajski ............ G01B 31/318566
  714/742
2010/0229060 A1* 9/2010 Mrugalski ...... G01B 31/318547
  714/738

OTHER PUBLICATIONS

IBM et al.; "Fault Simulation Diagnostics"; http://ip.com/IPCOM/000100881; Mar. 15, 2005.
IBM et al.; "Fault Isolations in Shift Register Latches"; http://ip.com/IPCOM/000084066; Mar. 2, 2005.
IBM et al.;"Error Detection/Fault Isolation for a Fiber-Optic Communication Link Using Parity"; http://ip.com/IPCOM/000120506; Apr. 2, 2005.

* cited by examiner

| PIN | MISR0: CHANNELS | | | | MISR1: CHANNELS | | | | MISR2: CHANNELS | | | | MISR3: CHANNELS | | | | MISR4: CHANNELS | | | | MISR5: CHANNELS | | | | MISR6: CHANNELS | | | | MISR7: CHANNELS | | | |
|---|---|---|---|---|---|---|---|---|---|---|---|---|---|---|---|---|---|---|---|---|---|---|---|---|---|---|---|---|---|---|---|---|
| 9 | 9 | 11 | 14 | | 4 | 8 | 14 | | 5 | 6 | 7 | | 6 | 8 | 25 | | 2 | 4 | 5 | | 4 | 19 | 30 | | 1 | 2 | 3 | | 0 | 2 | 30 |
| 21 | 7 | 20 | 21 | | 12 | 20 | 23 | | 17 | 18 | 19 | | 18 | 21 | 28 | | 10 | 16 | 17 | | 16 | 19 | 24 | | 13 | 15 | 31 | | 14 | 15 | 24 |
| 24 | 7 | 24 | 25 | | 3 | 15 | 23 | | 3 | 17 | 22 | | 7 | 20 | 21 | | 12 | 20 | 23 | | 17 | 18 | 19 | | 18 | 21 | 28 | | 10 | 16 | 17 |

| PIN | MISR8: CHANNELS | | | | MISR9: CHANNELS | | | | MISR10: CHANNELS | | | | MISR11: CHANNELS | | | | MISR12: CHANNELS | | | | MISR13: CHANNELS | | | | MISR14: CHANNELS | | | | MISR15: CHANNELS | | | |
|---|---|---|---|---|---|---|---|---|---|---|---|---|---|---|---|---|---|---|---|---|---|---|---|---|---|---|---|---|---|---|---|---|
| 9 | 0 | 1 | 22 | | 0 | 20 | 23 | | 1 | 28 | 31 | | 27 | 30 | 31 | | 5 | 18 | 29 | | 8 | 28 | 29 | | 9 | 11 | 27 | | 16 | 26 | |
| 21 | 12 | 13 | 21 | | 12 | 26 | 29 | | 6 | 10 | 11 | | 10 | 26 | 27 | | 9 | 11 | 14 | | 4 | 8 | 14 | | 5 | 6 | 7 | | 6 | 8 | 25 |
| 24 | 16 | 19 | 24 | | 13 | 15 | 31 | | 14 | 15 | 24 | | 12 | 13 | 21 | | 12 | 26 | 29 | | 6 | 10 | 11 | | 10 | 26 | 27 | | 9 | 11 | 14 |

| PIN | MISR16: CHANNELS | | | | MISR17: CHANNELS | | | | MISR18: CHANNELS | | | | MISR19: CHANNELS | | | | MISR20: CHANNELS | | | | MISR21: CHANNELS | | | | MISR22: CHANNELS | | | | MISR23: CHANNELS | | | |
|---|---|---|---|---|---|---|---|---|---|---|---|---|---|---|---|---|---|---|---|---|---|---|---|---|---|---|---|---|---|---|---|---|
| 9 | 13 | 22 | 25 | | 7 | 24 | 25 | | 3 | 15 | 23 | | 3 | 17 | 22 | | 7 | 20 | 21 | | 12 | 20 | 23 | | 17 | 18 | 19 | | 18 | 21 | 28 |
| 21 | 2 | 4 | 5 | | 4 | 19 | 30 | | 1 | 2 | 3 | | 0 | 22 | 30 | | 0 | 1 | 22 | | 0 | 20 | 23 | | 1 | 28 | 31 | | 27 | 30 | 31 |
| 24 | 4 | 8 | 14 | | 5 | 6 | 7 | | 6 | 8 | 25 | | 2 | 4 | 5 | | 4 | 19 | 30 | | 1 | 2 | 3 | | 0 | 2 | 30 | | 14 | 15 | 24 |

| PIN | MISR24: CHANNELS | | | | MISR25: CHANNELS | | | | MISR26: CHANNELS | | | | MISR27: CHANNELS | | | | MISR28: CHANNELS | | | | MISR29: CHANNELS | | | | MISR30: CHANNELS | | | | MISR31: CHANNELS | | | |
|---|---|---|---|---|---|---|---|---|---|---|---|---|---|---|---|---|---|---|---|---|---|---|---|---|---|---|---|---|---|---|---|---|
| 9 | 10 | 16 | 17 | | 16 | 19 | 24 | | 13 | 15 | 31 | | 14 | 15 | 24 | | 12 | 13 | 21 | | 12 | 26 | 29 | | 6 | 10 | 11 | | 10 | 26 | 27 |
| 21 | 5 | 18 | 29 | | 8 | 28 | 29 | | 9 | 11 | 27 | | 6 | 16 | 26 | | 7 | 22 | 25 | | 7 | 24 | 25 | | 3 | 15 | 23 | | 3 | 17 | 22 |
| 24 | 0 | 20 | 23 | | 1 | 28 | 31 | | 27 | 30 | 31 | | 5 | 18 | 29 | | 8 | 28 | 29 | | 9 | 11 | 27 | | 6 | 16 | 26 | | 13 | 22 | 25 |

| PIN | MISR0: CHANNELS | | MISR1: CHANNELS | | MISR2: CHANNELS | | MISR3: CHANNELS | | MISR4: CHANNELS | | MISR5: CHANNELS | | MISR6: CHANNELS | | MISR7: CHANNELS | |
|---|---|---|---|---|---|---|---|---|---|---|---|---|---|---|---|---|
| 1 | 0 | 1 | 0 | 20 | 1 | 31 | 27 | 30 | 5 | 18 | 8 | 28 | 9 | 11 | 6 | 16 |
| 2 | 0 | 22 | 0 | 23 | 0 | 23 | 1 | 28 | 27 | 30 | 5 | 18 | 8 | 28 | 9 | 11 |
| ... | 2 | 30 | 3 | 1 | 7 | 20 | 12 | 20 | 17 | 18 | 18 | 29 | 10 | 16 | 16 | 27 |
| 23 | 15 | 23 | 3 | 17 | 7 | 21 | 12 | 23 | 17 | 19 | 21 | 28 | 10 | 17 | 16 | 24 |
| 30 | 27 | 31 | 5 | 18 | 8 | 28 | 9 | 11 | 6 | 16 | 13 | 22 | 7 | 24 | 3 | 15 |
|  |  | 30 | 29 |  |  |  | 27 | 26 | 25 |  |  |  |  |  |  |  |

| PIN | MISR8: CHANNELS | | MISR9: CHANNELS | | MISR10: CHANNELS | | MISR11: CHANNELS | | MISR12: CHANNELS | | MISR13: CHANNELS | | MISR14: CHANNELS | | MISR15: CHANNELS | |
|---|---|---|---|---|---|---|---|---|---|---|---|---|---|---|---|---|
| 1 | 13 | 22 | 7 | 24 | 3 | 15 | 3 | 17 | 7 | 20 | 12 | 20 | 17 | 18 | 19 | 21 |
| 2 | 6 | 16 | 13 | 22 | 7 | 24 | 3 | 15 | 9 | 17 | 7 | 20 | 12 | 20 | 17 | 18 |
| ... | 13 | 15 | 14 | 15 | 12 | 13 | 12 | 17 | 6 | 10 | 10 | 26 | 9 | 11 | 4 | 8 |
| 23 | 13 | 15 | 14 | 15 | 12 | 13 | 12 | 17 | 6 | 10 | 10 | 26 | 9 | 11 | 4 | 8 |
| 30 | 3 | 17 | 7 | 20 | 12 | 20 | 17 | 18 | 18 | 21 | 10 | 16 | 16 | 19 | 13 | 15 |
|  | 22 | 25 | 22 | 21 | 20 | 23 | 17 | 19 | 21 | 28 |  | 17 | 24 | 31 |  |  |

| PIN | MISR16: CHANNELS | | MISR17: CHANNELS | | MISR18: CHANNELS | | MISR19: CHANNELS | | MISR20: CHANNELS | | MISR21: CHANNELS | | MISR22: CHANNELS | | MISR23: CHANNELS | |
|---|---|---|---|---|---|---|---|---|---|---|---|---|---|---|---|---|
| 1 | 10 | 16 | 17 | 16 | 19 | 24 | 13 | 15 | 24 | 14 | 15 | 21 | 12 | 26 | 29 | 6 | 10 | 11 | 10 | 26 |
| 2 | 18 | 21 | 28 | 10 | 16 | 17 | 16 | 19 | 24 | 13 | 15 | 31 | 12 | 13 | 21 | 12 | 26 | 29 | 6 | 10 |
| 23 | 5 | 6 | 7 | 6 | 8 | 25 | 2 | 4 | 5 | 1 | 2 | 3 | 0 | 2 | 30 | 0 | 1 | 22 | 0 | 20 |
| 30 | 14 | 15 | 24 | 12 | 13 | 21 | 12 | 26 | 29 | 6 | 10 | 11 | 10 | 26 | 27 | 9 | 11 | 14 | 4 | 8 |

| PIN | MISR24: CHANNELS | | MISR25: CHANNELS | | MISR26: CHANNELS | | MISR27: CHANNELS | | MISR28: CHANNELS | | MISR29: CHANNELS | | MISR30: CHANNELS | | MISR31: CHANNELS | |
|---|---|---|---|---|---|---|---|---|---|---|---|---|---|---|---|---|
| 1 | 9 | 11 | 14 | 4 | 8 | 14 | 5 | 6 | 7 | 6 | 8 | 25 | 2 | 4 | 5 | 4 | 19 | 30 | 1 | 2 | 3 | 0 | 11 | 30 |
| 2 | 10 | 26 | 27 | 9 | 11 | 14 | 4 | 8 | 14 | 5 | 6 | 7 | 6 | 8 | 25 | 2 | 4 | 5 | 4 | 19 | 30 | 11 | 3 |
| 23 | 1 | 28 | 31 | 27 | 30 | 31 | 5 | 18 | 29 | 28 | 29 | 7 | 9 | 11 | 27 | 6 | 16 | 26 | 13 | 22 | 25 | 7 | 24 | 25 |
| 30 | 6 | 8 | 25 | 2 | 4 | 5 | 4 | 19 | 30 | 1 | 2 | 3 | 0 | 2 | 30 | 0 | 1 | 22 | 0 | 20 | 23 | 11 | 28 | 31 |

| PIN | MISR0: CHANNELS | | | MISR5: CHANNELS | | | MISR10: CHANNELS | | |
|---|---|---|---|---|---|---|---|---|---|
| 1  | 0  | 1  | 22 | 8  | 28 | 29 | 3  | 15 | 23 |
| 4  | 4  | 19 | 30 | 1  | 28 | 31 | 16 | 26 | 29 |
| 6  | 6  | 8  | 25 | 0  | 1  | 22 | 8  | 28 | 29 |
| 13 | 12 | 13 | 21 | 4  | 8  | 14 | 1  | 2  | 3  |
| 15 | 13 | 15 | 31 | 10 | 26 | 27 | 2  | 4  | 5  |
| 16 | 16 | 19 | 24 | 6  | 10 | 11 | 6  | 8  | 25 |
| 18 | 18 | 21 | 28 | 12 | 13 | 21 | 4  | 8  | 14 |
| 23 | 3  | 15 | 23 | 18 | 21 | 28 | 12 | 13 | 21 |
| 25 | 13 | 22 | 25 | 12 | 20 | 23 | 13 | 15 | 31 |

| PIN | MISR0: CHANNELS | | | MISR5: CHANNELS | | | MISR10: CHANNELS | | |
|---|---|---|---|---|---|---|---|---|---|
| 0 | 0 | 20 | 23 | 9 | 11 | 27 | 3 | 17 | 22 |
| 3 | 1 | 2 | 3 | 27 | 30 | 31 | 13 | 22 | 25 |
| 5 | 2 | 4 | 5 | 9 | 20 | 23 | 9 | 11 | 27 |

| PIN | MISR0: CHANNELS | | | MISR5: CHANNELS | | | MISR10: CHANNELS | | |
|---|---|---|---|---|---|---|---|---|---|
| 0  | 0  | 22 | 23 | 9  | 11 | 27 | 3  | 17 | 22 |
| 3  | 1  | 2  | 3  | 27 | 30 | 31 | 13 | 22 | 25 |
| 5  | 2  | 4  | 5  | 0  | 20 | 23 | 9  | 11 | 27 |
| 1  | 0  | 1  | 22 | 8  | 28 | 29 | 3  | 15 | 23 |
| 2  | 0  | 2  | 30 | 5  | 18 | 29 | 7  | 24 | 25 |
| 4  | 4  | 19 | 30 | 1  | 28 | 31 | 9  | 16 | 26 |
| 6  | 6  | 8  | 25 | 0  | 1  | 22 | 8  | 28 | 29 |
| 7  | 5  | 6  | 7  | 0  | 2  | 30 | 5  | 18 | 29 |
| 8  | 4  | 8  | 14 | 1  | 2  | 3  | 27 | 30 | 31 |
| 9  | 9  | 11 | 14 | 4  | 19 | 30 | 1  | 28 | 31 |
| 11 | 6  | 10 | 11 | 6  | 8  | 25 | 0  | 1  | 22 |
| 13 | 12 | 13 | 21 | 4  | 8  | 14 | 1  | 2  | 3  |
| 14 | 14 | 15 | 24 | 9  | 11 | 14 | 4  | 19 | 30 |
| 15 | 13 | 15 | 31 | 10 | 26 | 27 | 2  | 4  | 5  |
| 16 | 16 | 19 | 24 | 6  | 10 | 11 | 6  | 8  | 25 |
| 19 | 17 | 18 | 19 | 14 | 15 | 24 | 9  | 11 | 14 |
| 20 | 12 | 20 | 23 | 13 | 15 | 31 | 10 | 26 | 27 |
| 21 | 7  | 20 | 21 | 16 | 19 | 24 | 6  | 10 | 11 |
| 22 | 3  | 17 | 22 | 10 | 16 | 17 | 12 | 26 | 29 |
| 23 | 3  | 15 | 23 | 18 | 21 | 28 | 12 | 13 | 21 |
| 25 | 13 | 22 | 25 | 12 | 20 | 23 | 13 | 15 | 31 |
| 26 | 9  | 16 | 26 | 7  | 20 | 21 | 16 | 19 | 24 |
| 27 | 9  | 11 | 27 | 3  | 17 | 22 | 10 | 16 | 17 |
| 28 | 8  | 28 | 29 | 3  | 15 | 23 | 18 | 21 | 28 |
| 29 | 5  | 18 | 29 | 7  | 24 | 25 | 17 | 18 | 19 |
| 31 | 1  | 28 | 31 | 9  | 16 | 26 | 7  | 20 | 21 |

FIG. 11

IMPLEMENTING PRIORITIZED COMPRESSED FAILURE DEFECTS FOR EFFICIENT SCAN DIAGNOSTICS

FIELD OF THE INVENTION

The present invention relates generally to the data processing field, and more particularly, relates to a method and circuit for implementing enhanced scan data testing to prioritize faults to be simulated during diagnostic isolation, and to reduce the number of faults requiring re-simulation using an exclusive OR (XOR) logic network and multiple input signature register (MISR) diagnostics, and a design structure on which the subject circuit resides.

DESCRIPTION OF THE RELATED ART

Circuits often are prone to defects introduced during a manufacturing process. To test for defects, a scan input may be applied to scan channels, and the result of the scan input that is applied to the scan channels may be analyzed. The test may include large numbers and variations of scan inputs being applied to scan channels of the circuit. Typically the tests take a great amount of time, produce large amounts of data for analysis, and require large amounts of resources for that analysis.

Currently diagnostic data typically is scanned out of designs in total. As such a very large amount of data is stored for usually a fairly small amount of useful information. This takes significant time and data storage.

As Application Specific Integrated Circuit (ASIC) and Processor chips continue to get larger, test data volume and test time naturally increase as well. It continually becomes even more important to increase test efficiency. In typical scan pattern based tests, chips are tested by scanning data into every latch in the design through a narrow, usually 32-bit wide, scan-in port and triggering functional clock pulses. Then, data is scanned out through another narrow, usually 32-bit wide, scan-out port, where it is compared to pre-computed values.

There are a few different ways that this scan-in bus can be delivered to and collected from all parts of a chip. In the naïve approach, each of the 32 scan chains contain 1/32nd of the total logic of the chip. This works and allows for the most unique data in each scan cycle, but it takes a lot of data volume to make this possible. Plus, tests tend to be quite long and require a lot of data since it requires that the entire chip is scanned in and out in each test iteration.

Another know approach fans-out data to many more scan segments than the 32 pins, as well as compressing the data from those multiple scan segments with an XOR network to the smaller 32 pins. While this reduces the data volume, it actually increases the diagnostics test time, as all possible failures compressed into each pin are simulated and graded.

SUMMARY OF THE INVENTION

Principal aspects of the present invention are to provide a method and circuit for implementing enhanced scan data testing using an XOR network to prioritize faults to be simulated during diagnostic isolation, and reducing the number of faults requiring re-simulation, and a design structure on which the subject circuit resides. Other important aspects of the present invention are to provide such method and circuit substantially without negative effects and that overcome many of the disadvantages of prior art arrangements.

In brief, a method and circuit are provided for implementing enhanced scan data testing using an XOR network to prioritize faults to be simulated during diagnostic isolation, and reducing the number of faults requiring re-simulation. A test is run, scan data are applied to scan channels using the XOR network and the output scan data are unloaded. A list of possible faults is identified based on pin flips, and the possible faults to be simulated during diagnostic isolation are prioritized by a number of occurrences in the list, and possible faults are further graded to reduce the number of possible faults requiring re-simulation.

In accordance with features of the invention, enhanced scan data testing is effectively and efficiently implemented, enabling efficient diagnostic simulation.

BRIEF DESCRIPTION OF THE DRAWINGS

The present invention together with the above and other objects and advantages may best be understood from the following detailed description of the preferred embodiments of the invention illustrated in the drawings, wherein:

FIGS. 5 and 6 illustrate respective example test results from test scan channels in accordance with preferred embodiments of the invention;

FIGS. 9, 10, and 11 illustrate respective example test results from test scan channels in accordance with preferred embodiments of the invention;

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuits are provided for implementing enhanced scan data testing to prioritize faults to be simulated during diagnostic isolation, and for reducing the number of faults requiring re-simulation using an XOR logic network and providing a multiple input signature register (MISR) for data collection provided with an associated scan channel for implementing Multiple Input Signature Register (MISR) compression methods for test time reduction.

Figure 1:
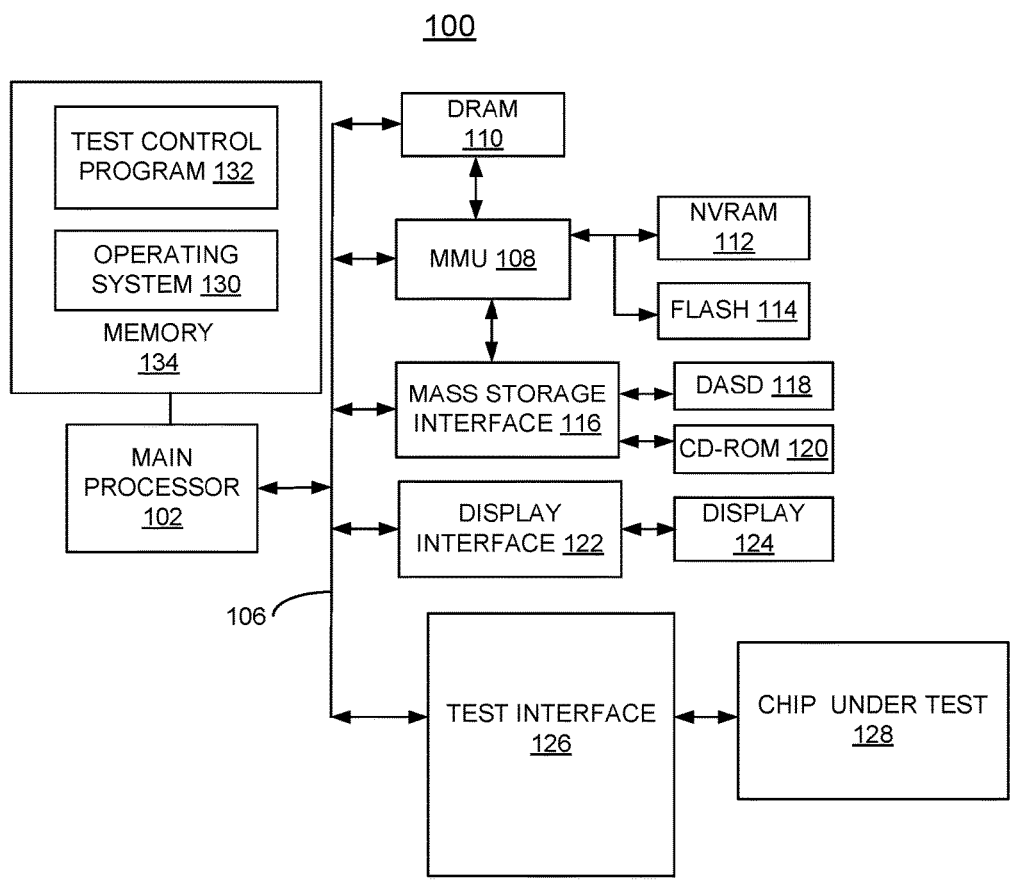
FIG. 1 is a block diagram representation illustrating an exemplary computer test system for implementing a method for using an XOR network to prioritize faults to be simulated during diagnostic isolation, and reducing the number of faults requiring re-simulation, and a design structure on which the subject circuit resides in accordance with the preferred embodiment.

Having reference now to the drawings, in FIG. 1, there is shown an exemplary computer test system for implementing enhanced scan data testing using an XOR network to prioritize faults to be simulated during diagnostic isolation, and reducing the number of faults requiring re-simulation generally designated by the reference character 100 in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106. An integrated circuit device or chip under test 128 is coupled to the test interface 126. Computer system 100 includes an operating system 130, and a test control program 132 of the preferred embodiment resident in a memory 134.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors.

Figure 2:
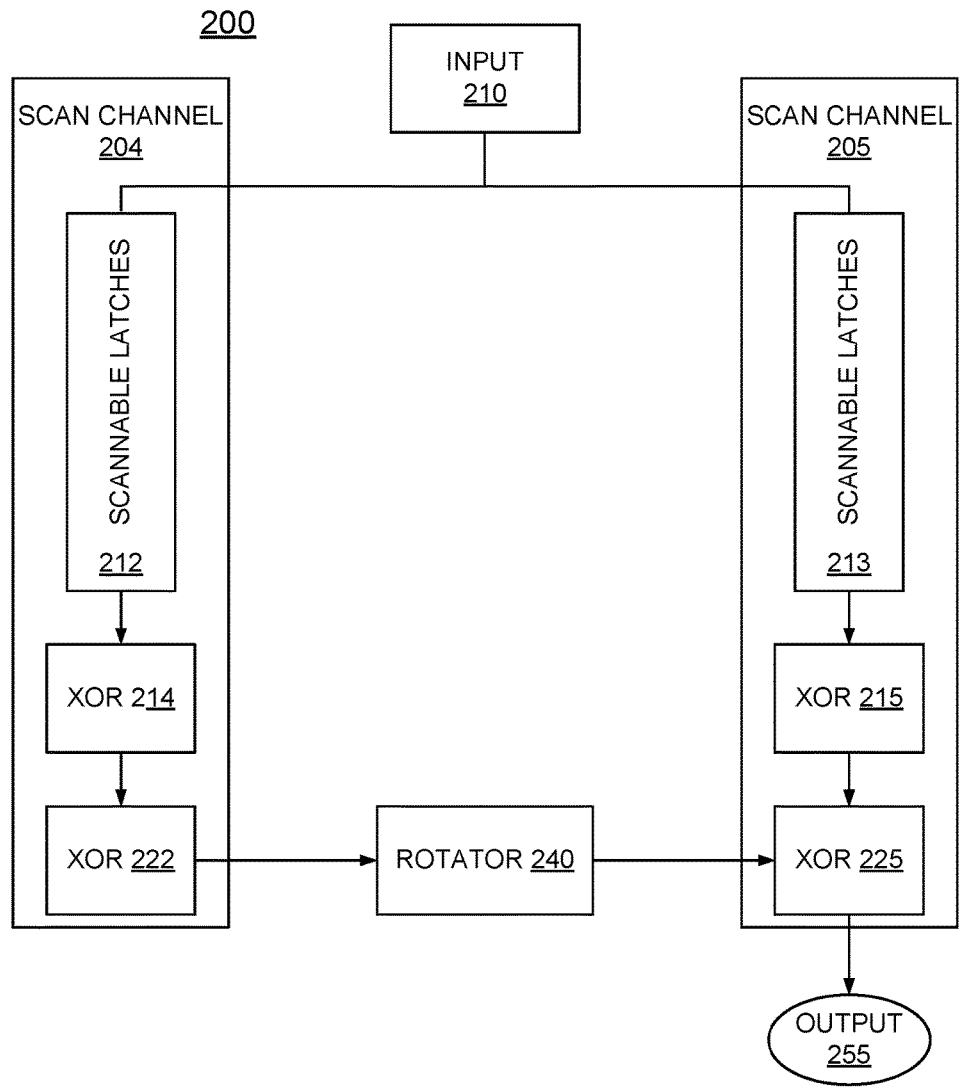
FIGS. 2 and 3 illustrate an example test structures used to test scan channels in accordance with preferred embodiments of the invention.
Figure 3:
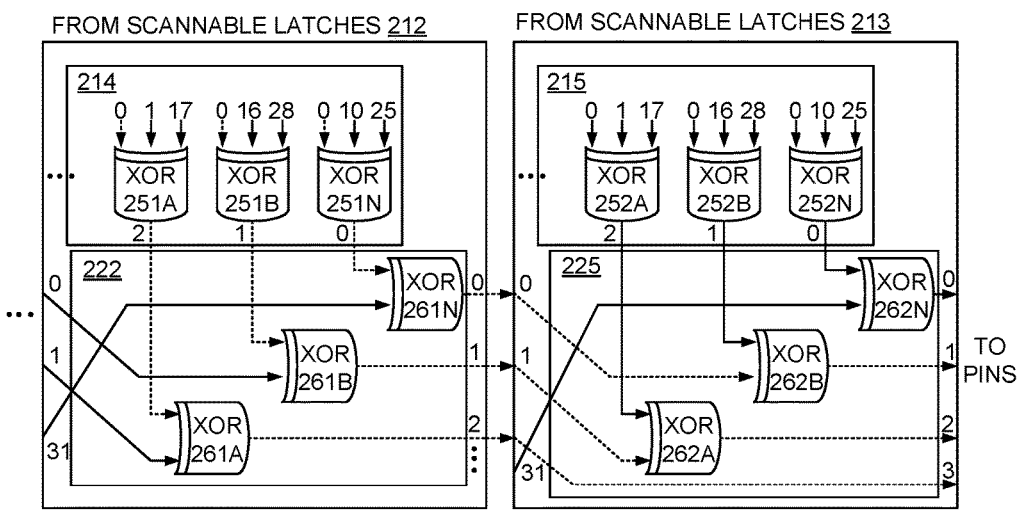

Referring now to FIGS. 2 and 3, there are respectively shown examples of a test structure optionally used to test scan channels generally designated by the respective reference characters 200, 250. Test structure 200, 250 assigns a unique pin decode for each unique latch flip for up to 1024 channels in the example shown. It should be understood that test structure 200, 250 can easily be expanded to 4096 channels, while still using only 32 pins and the 3 unique pin fan-out style, but for illustration the 1024 channel version is used. Test structure 200, 250 includes, for example, first and second scan channels 204, 205, on a chip being tested. Also, for example the first scan channel 204 or second scan channel 205 may represent sets of channels. A test input 210 is coupled to the first scan channel 204 and second scan channel 205.

Each of the first and second scan channels 204, 205 includes a respective plurality of scannable latches 212, 213 coupled to a respective first exclusive OR (XOR) 214, 215. Each of the respective first exclusive OR (XOR) 214, 215 is coupled to a respective second exclusive OR (XOR) 222, 225. A rotator 240 is coupled between to the output of second exclusive OR (XOR) 222 of the first scan channel 204 and the input of the second exclusive OR (XOR) 224 of the second scan channel 205.

Scannable latches 212 and 213 may be configured to receive input data, such as input 210, to apply to logic circuits on the chip and to receive outputs from logic circuits on the chip. For example, the scan channels 204 and 205 may include any number of scannable latches 212 and 213. For example, scannable latches 212 and 213 may be referred to as logic elements. Scannable latches 212 and 213 may be in communication with logic circuits on a chip. Logic circuits may not be of equal number to scannable latches 212 or 213. For example, logic circuits may be used, assigned, or in communication with specific scannable latches of 212 or 213 or they may be shared by scannable latches of 212 or 213. The scannable latches 212 and 213 may be configured to receive the output, or outputs, from the logic circuits of the chip.

The first XOR 214 of the first scan channel 204 may be used to hash output data from the first plurality of scannable latches 212. This may be known as using a XOR-based hash functions. The XOR 214 may be used to compute each possible failing location detection point from the exclusive or (XOR) of a subset of the bits in the address. For example, the output of the hashing of the XOR 214 may be referred to as, but not limited to, returned values, hash codes, hash sums, hamming codes, checksums, or simply hashes. The XOR-based hash function may be used to generate fixed-length output data that acts as a reference to the original data. The reference may improve speed or efficiency when referencing the output data from the first plurality of scannable latches 212.

As shown, the output of the first XOR 214 of the first scan channel 204 may then be transmitted into the second XOR 222 of the first scan channel 204. For example, the second XOR 222 of the first scan channel 204 may be used to hash the output from the first XOR 214 of the first scan channel 204. The output of the second XOR 222 of the first scan channel 204 may be applied to the rotator 240. The data received by the rotator 240 may be an indicator, value, or sequence related to the second XOR 222 of the first scan channel 204. The rotator 240 may use the data to output adjustment data from the second XOR 222 of the first scan channel 204 to the second XOR 225 of the second scan channel 205. The first XOR 215 of the second scan channel 205 may be used to hash output data from the second plurality of scannable latches 213. This may be similar to the action taken by the first XOR 214 of the first channel 204, and may also be a XOR-based hash function. For example, the hashing may improve speed or efficiency when referencing the output data from the second plurality of scannable latches 213.

As shown, the output of the first XOR 215 of the second scan channel 205 may be transmitted into the second XOR 225 of the second scan channel 205. For example, the second XOR 225 of the second scan channel 205 may be used to hash the output from the first XOR 215 of the second scan channel 205 and also use adjustment data from the rotator 240. The output of the second XOR 225 of the second scan channel 205 may be an output 255 created using the adjustment data from the rotator 240 and output of the first XOR 215 of the second scan channel 205. Output 205 may be transmitted to a device, system, hardware, software, or firmware for analysis. Also, output 255 may be stored for later use or analysis. Also, this may be extended to any number of scan channels beyond 204, 205.

FIG. 3 illustrates in more detail a test structure 250 that may be used to test scan channels in FIG. 2, first scan channel 204 and second scan channel 205, on a chip. In the illustrated embodiment, first XOR 214 of the first scan channel 204, second XOR 222 of the first scan channel 204, first XOR 215 of the second scan channel 205, and second XOR 225 of the second scan channel 205 each are now plurality of XOR functions. First XOR 214 of the first scan channel 204 may now constitute XOR 251A-251N. Second XOR 222 of the first scan channel 204 may now constitute XOR 261A-261N. First XOR 215 of the second scan channel 205 may now constitute XOR 252A-252N. Second XOR 225 of the second scan channel 205 may now constitute XOR 262A-262N. The rotator 240, as shown in FIG. 2, may receive data from the serially connected first scan channel 204, here the data may come from the individual XOR 261A-261N of the second XOR 222 of the first scan channel 204. Also, the data from the first scan channel 204 may come from other elements of the first scan channel 204. The rotator 240 may adjust that data so that the adjustment data it transmits to the second XOR 225 of the second channel 205 is used by the respective XOR 262A-262N with the XOR output of the first XOR 215 of the second scan channel 205. The adjustment data transmitted by the rotator 240 may, in some embodiments, modify the output 255 of the second scan channel 205. In various embodiments, it may rotate, modify, or adjust the output such that the output 255, or the way the output 255 is presented may be unique and identifiable from the first scan channel 204, or other scan channels that may be part of the chip.

For example, embodiments may include 32 XORs for respective XORs 251A-251N, 252A-252N, 261A-261N, and 262A-262N. This may include 32 XOR 251A-251N and 252A-252N where the XORs may be, but are not limited to, encodes, hamming codes, or hashing for the 32 bit group of the respective scan channels 204 and 205. The second sets of 32 XORs 261A-261N and 262A-262N may be used to adjust the pins the output of the respective scan channels 204 and 205 comes out of in relation to each other. In various embodiments using these sets, the hashing and rotator 240 may be set up such that the output 255 may have numerous non-repeating values. This may allow for quicker or more efficient identification or location of errors or better physical wiring.

For example, the rotator 240 may receive data from a serially connected first scan channel, such as first scan channel 204. In various embodiments, such as shown in FIG. 2, may redirect or rotate the input from one XOR in the first scan channel 204 to a non-equivalent XOR in the second scan channel 205. For example, the rotator 240 illustrated uses the output from XOR 261B of the first scan channel 204 to send the adjustment output to XOR 262A of the second scan channel 205. This offsetting or rotation of output to receiving XOR may be used to make unique identifiers, codes, or outputs. In various embodiments, the rotator 240 may receive output from one or more elements of the first scan channel 204. In some embodiments, the output may be sent, transmitted, or driven by elements other than an XOR in the first scan channel 204.

Figure 4:
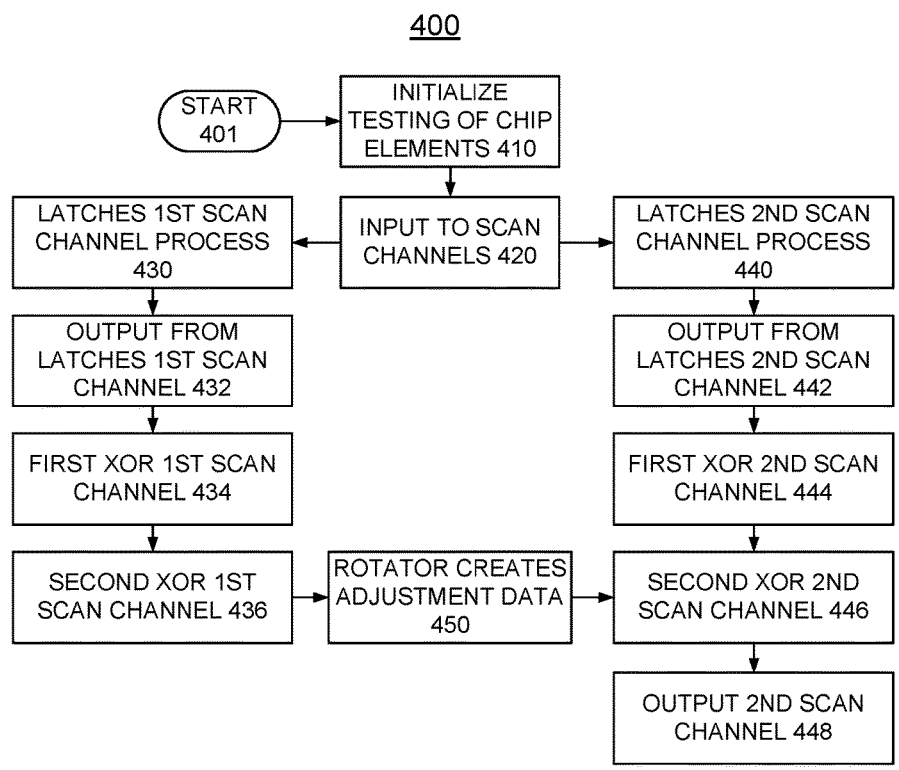
FIG. 4 is a flow chart illustrating example test operations in accordance with the preferred embodiments of the invention.

Referring to FIG. 4, there is shown a flow chart illustrating example test operations for implementing enhanced scan data testing using an XOR network to prioritize faults to be simulated during diagnostic isolation, and reducing the number of faults requiring re-simulation. FIG. 4 is a flowchart illustrating a method 400 for testing a first and second scan channels. The method 400 may include multiple XORs being used on the output from the scannable latches, such as 212 and 213, for each scan channel and may also include a rotator 240 creating adjustment data using output from the first scan channel, such as 204, and second scan channel, such as 205, using the adjustment data for example in a second XOR 225 of the second scan channel 205. The method 400 starts at block 401. In block 410, testing is initialized of the chip elements. This testing may include two or more scan channels for circuits on the chip. For example, the testing may be initialized by a variety of entities internal and external to the chip. For example, the testing may be initialized by or due to, but not limited to, a programmed testing schedule, an error in output from the chip being detected, or an external testing device activating a testing cycle. In block 420, input is transmitted into scan channels, such as first and second scan channels 204, 205. For example, the transmitted input may be the same for each scan channel or different. For example, the transmission to the two channels may occur simultaneously or in any sequence.

In block 430, the plurality of scannable latches of the first scan channel 112 may process the input form block 420 through the logic circuits on a chip and receive output data from logic circuits on the chip based upon the input. In block 432, the scannable latches 212 of the first channel 204 may output the received or processed data into other elements of the first scan channel 204. In block 434, the output data of the scannable latches 212 of the first scan channel 204 may be received and processed by the first XOR 214 of the first channel 204. The XOR may hash the output data from the scannable latches of this channel 204, and in other embodiments for other channels. The hashing may improve speed or efficiency when referencing the output data by other elements of the scan channel or elements or devices connected to the scan channel. In block 436, the hashed output data from the first XOR 214 may be processed by a second XOR 222 of the first scan channel 204. In various embodiments, the second XOR 222 of the first scan channel 204 may be used to hash the output from the first XOR 214 of the first scan channel 204.

In block 450, the second XOR 222 of the first scan channel 204 may have data that is transmitted to the rotator 240. In various embodiments, the data received by the rotator 240 may be an indicator, value, or sequence related to the second XOR 222 of the first scan channel 204. The rotator 240 may use the data to create output adjustment data from the second XOR 222 of the first scan channel 204 to the second XOR 225 of the second scan channel 205. In block 440, the plurality of scannable latches 213 of the second scan channel 204 may process the input from block 420 through the logic circuits on a chip and receive output data from logic circuits on the chip based upon the input. In block 442, the scannable latches 213 of the second channel 205 may output the received or processed data into other elements of the second scan channel 205. In block 444, the output data of the scannable latches 213 of the second scan channel 205 may be received and processed by the first XOR 215 of the second channel 205. The XOR may hash the output data from the scannable latches. The hashing may improve speed or efficiency when referencing the output data by other elements of the scan channel or elements or devices connected to the scan channel.

In block 446, the hashed output data from the first XOR may be processed by a second XOR 225 of the second scan channel 205. In various embodiments, the second XOR 222 of the first scan channel 204 may be used to hash the output from the first XOR 214 of the first scan channel 204 and may use adjustment data from the rotator 240. The output of the second XOR 225 of the second scan channel 205 may be an output 255 created using the adjustment data from the rotator 240 and output of the first XOR 215 of the second scan channel 205. The adjustment data transmitted by the rotator 240 may, in some embodiments, modify the output 255 of the second scan channel 205. For example, it may rotate, modify, or adjust the output such that the output, or the way the output is presented may be unique and identifiable from the first scan channel 204, or other scan channels that may be part of the chip. For example, if first scan channel 204 and second scan channel 205 have errors that would result in the same hash value after the first XOR in each scan channel, the use of the second XOR and the adjustment data from the rotator may result in unique output for the errors for each channel. The output of the second XOR 225 of the second scan channel 205 may be an output 255. In block 448, the output of the second scan channel, output 255, may be transmitted to a device, system, hardware, software, or firmware for analysis. In other embodiments, output 255 may be stored for later use or analysis.

In various embodiments, blocks of or steps of method 400 may be absent or more numerous. In various embodiments, the blocks, or steps, may be in a different order or sequential instead of parallel. For example, the illustrated embodiments has the blocks for the first scan channel 104 in parallel to the blocks for the second scan channel 105 in some embodiments, blocks 440-448 may not occur until after block 448 occurs.

Referring now to FIGS. 5 and 6, there are shown respective example test results generally designated by respective reference characters 500, 600 from test scan channels in accordance with preferred embodiments of the invention. In FIGS. 5 and 6 the labels of MISR0-MISR31, for example, represent 32 channel groups for the respective example test results 500, 600.

In FIG. 5, example test results 500 show when 1 latch flips, 3 pins change and testing tools can trace the 3 pins to each of the 96 possible sources. As shown in test results 500, the fail flips pins 9, 21, and 24 with the pins shown at the right side of the illustrated test results. Note that there is some overlapping call outs reducing the 288 (96*3) flops to 265 flops for analysis. Prioritizing these flops to the ones with the most call outs, points directly to the correct flop as the only one having 3 call outs, with additionally only 20 with 2 call outs.

In FIG. 6, example test results 600 show when if there are 2 detection flops that feed 1 overlapping pin, thus erasing one detection point and showing on only 4 pins or pins 1, 2, 23, and 30. In this case the 384 (96*4) flops is reduced to 342 due to overlapping call outs. Again prioritizing these 342 flops with the 42 that have 2 call outs first will allow the actual fail detect point cones of MISR0 channel 30 and MISR5 channel 28 to be simulated early and post a high score.

For example, once the flops are graded, a fault list for simulation can be systematically created based on each of these detection flops. However rather than create a graded fault list for all cones implicated by both the 1 and 2 pin flip detection points, it can be more efficient to prioritize only those within the multiple pin flip list. Then faults that propagate to two detection flops can be graded as 4s, or 3 points as 6s etc. This new graded fault list can then be used to determine the order of simulation. Note that while the pin/flop based sorting will be very quick, this fault based sorting might be slower than the actual simulation itself. Therefore simply using the pin/flop sort might be the most efficient path to the best result.

In FIGS. 5 and 6, these examples 500, 600 have dealt with 1 or 2 detection flops across 1 scan cycle. Typically a failure will show up in many flops and on many scan cycles with simulation trying to score faults in all those cones against all the pin flips in all the scan cycles.

In accordance with features of the invention, a failure that shows up in 10 flops in 10 different scan cycles will produce 2650 (265*10) unique flops for analysis. If each is prioritized as above the 10-3 pin detection points will rise to the top of the list and produce the correct high scored results almost immediately. Even the 2 pin detects prioritize the list to net 210 (10*21), should further scoring be required. If the 10 flops were pairs in 5 scan cycles, the 1710 (342*5) unique flops for analysis can be prioritized to the 210 (42*5) that effect 2 pins. Each of these examples can further be reduced by again grading the faults in the cones that feed more than one potential detection flop. Also again this might be slower that just simulating the fault list that has been already reduced by this common pin/flop scheme.

In accordance with features of the invention, acquiring passing MISR results per 32 bits, for example, in this example 600 can be used to eliminate channels from the list.

Figure 7:
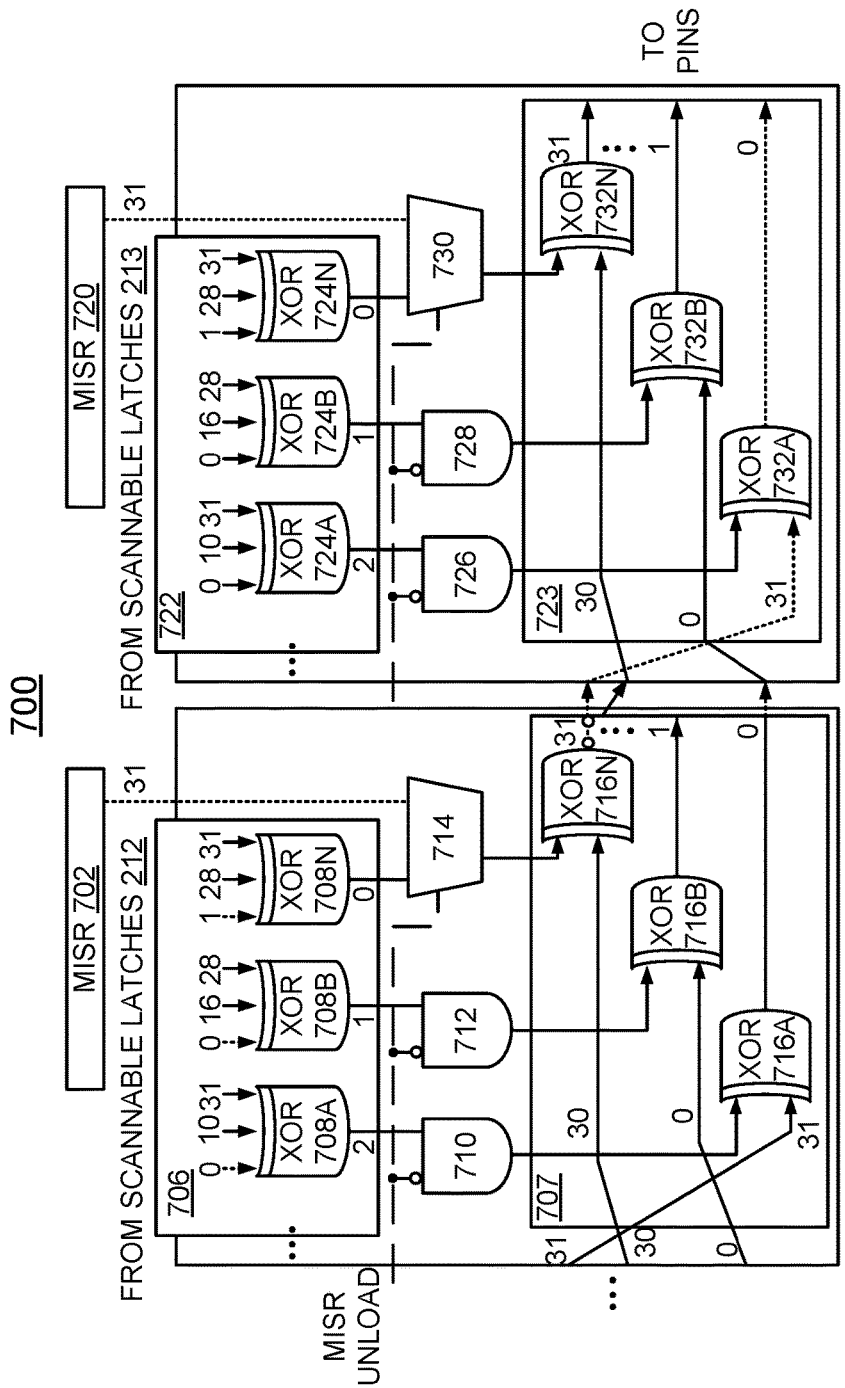
FIGS. 7 and 8 illustrate an example circuits used for implementing enhanced scan testing in accordance with preferred embodiments of the invention.
Figure 8:
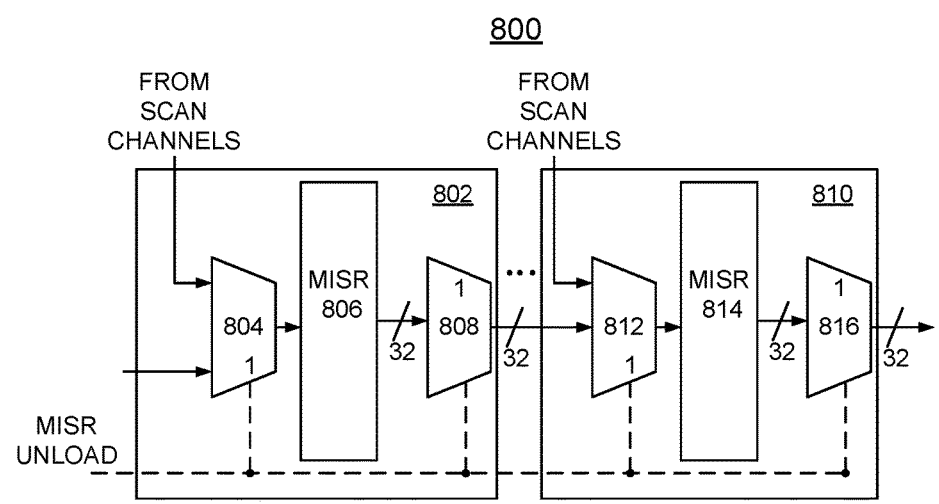

Referring now to FIGS. 7 and 8, there are shown respective example circuits generally designated by respective reference characters 700, 800 used for implementing enhanced scan testing with enhanced MISR solutions in accordance with preferred embodiments of the invention.

In the illustrated circuit 700, includes a first MISR 702 and, a second MISR 720 respectively providing an input to the first scan channel 204, and the second scan channel 205. Circuit 700 includes the first XOR 706 of the first scan channel 204, a second XOR 707 of the first scan channel 204, a first XOR 722 of the second scan channel 205, and a second XOR 723 of the second scan channel 205 each including a plurality of XOR functions. First XOR 706 of the first scan channel 204 includes XOR 708A-708N. Second XOR 707 of the second scan channel 205 includes XOR 716A-716N. First XOR 722 of the second scan channel 205 includes XOR 724A-724N. Second XOR 723 of the second scan channel 205 includes XOR 732A-732N. A respective AND gate 710, 712, and multiplexer 714 receives data from the serially connected first scan channel 204, with data from the individual XOR 708A, 708B and 708N of the first XOR 706 of the first scan channel 204. Multiplexer 714 receives data from the MISR 702. Each respective AND gate 710, 712, and multiplexer 714 applies or transmits data from MISR 702 and the XOR 708A, 708B and 708N of the first XOR 706 to the XOR 716N, and the individual to the respective XOR 716A, 716B and 716N of the second XOR 707 of the first channel 204 with the XOR output coupled to the XOR 732A, 732B and 732N of the second XOR 723 of the second channel 205. A respective AND gate 726, 728, and multiplexer 730 receives data from the serially connected second scan channel 205, with data from the individual XOR 724A, 724B and 724N of the first XOR 722 of the second scan channel 205. Multiplexer 730 receives data from the MISR 720. A MISR unload input is applied to an inverted input of the respective AND gates 710, 712, 726, 728, and applied to a select input of the multiplexers 714, 730. Each respective AND gate 726, 728, and multiplexer 730 applies or transmits data from MISR 720 to the XOR 732N, and the individual XOR 724A, 724B and 724N to the respective XOR 732A, 732B and 732N of the second XOR 723 of the second channel 205 with the XOR output coupled to the respective pins.

The illustrated arrangement of circuit 700 reuses the XOR network to unload the 32 MISRs, (MISR0-MISR31 of FIG.

6) with 32 additional scan cycles (each serially down a path to a single pin). Note that the MISR results are for the entire 32 channels feeding each and all scan cycles. As a result MISRs are less tolerant to unknown states (X's) than the compressed scan output and may benefit from masking. However even without masking many of the MISR will not contain unknown states. Other more common methods could also be used to unload the MISRs, such as serially unloading all through a single scan path (common, but requires 1000 scan cycles), or reading each in parallel (less common and requires 32 separate selection controls). The illustrated arrangement of circuit 700 is both minimal from a scan cycle perspective, and also only requires a single select to enable. X's and are useful in detection flop reduction.

The illustrated arrangement of circuit 700 is good until more MISRs exist than scan outputs, in this example 32. Then either another select for the next 32 would need to be added.

Circuit 800 of FIG. 8 is effective, for example when more MISRs exist than scan outputs, in the example 32 of FIG. 6. Circuit 800 includes more logic and wiring than circuit 700. Circuit 800 includes a first multiplexer 804 receiving an input from the scan channels and providing an input to a MISR 806, and a second multiplexer 808 at the output of MISR 806. Multiplexer 808 provides an input to another multiplexer 812 receiving an input from the scan channels and providing an input to a MISR 814, and with another multiplexer 816 at the output of MISR 814. A MISR unload input is applied to a select input of the multiplexers 804, 808, 812, and 817. Circuit 800 is expandable beyond 32 and efficiently unloads all MISRs, illustrated by MISRs 806, 814.

Referring again to FIG. 5, the simple case with a single flop fail will result in 31 of 32 MISRs passing, eliminating all flop/pin combinations associated with those MISRs. This would result again in one flop associated with 3 pins and 6 with 1 each.

Referring again to FIG. 6, the case with 2 flops overlapping has 30 of 32 MISRs passing. This eliminates any channels associated with those MISRs, resulting in 5 flops that effect 2 pins and 14 that effect only one pin. This drops the simulation from 42 with 2 pin flip down to 5, and a total count of 324 to 19. Extending this to the example of 10 flops pair wise across 5 scan cycles and the 1710 total drops to 95 (19*5), and the priority pairs drop from 210 to 25(5*5). Another variation would be to pre-seed the MISRs so that the passing result is all 0's. Then an OR could be used to create a fail observe signal. Each observe signal can be routed to the pins in the same manner as FIG. 7 until all pins are used (in this example 32 is the limit). This results in a single observe action for 32 MISRs, but a new select and observe for each 32 beyond that. This can be even more important for cases that have even more flops changing in the same scan cycle.

FIGS. 9, 10, and 11 illustrate respective example test results from test scan channels in accordance with preferred embodiments of the invention generally designated by respective reference characters 900, 1000, and 1100.

FIG. 9 show the example results 900 when the three failing channels highlighted fail in these three MISRs. While the current state of the art would have pulled in about 700 possible flops without MISR knowledge (or the prioritization scheme), example 900 shows 3 prime candidates with 3 pins changes, 16 candidates with 2 pin changes, and 40 with 1 pin change.

FIG. 10 show the example results 1000 of a triple fail of MISR0 bit 6, MISR5 bit 0 and MISR10 bit 22 which completely erases the effects at the pins of the MISR0 bit 6 fail (the other fails flip all 3 pins that would have flipped back to the correct values). The 3 resulting pins would actually point very clearly and incorrectly back to MISR1 bit 1. However the other failing locations from the same fail, but in different scan cycles would have likely included the correct faults for simulation somewhat alleviating the erasing effect. Prioritization and MISR knowledge again reduce the number of simulations needed to get to the best scoring result. In this case, the 3 pairs include one detecting flop, the 21 remaining include another detecting flop.

FIG. 11 show the example results 1100 with a new list created. While example 1000 is likely enough information to get good scoring on enough faults, if not, then a new list could be created by adding all channels back into the list that share a pin with a channel already in the list, as shown in FIG. 11. Note that this list of example results 1100 is shorter than adding back in all 96 of the channels that the failing MISRs contain. In example results 1100 there now would exist 24 triples that were listed at least once in the original flops (this is actually all the original now as triples), plus 20 that share a pin with the original list and 7 triples that share no pins with the original list. Simulating all 51 would now include the missing channels 6 from MISR6 and still falls within a very reasonable simulation count.

Note that if in this case MISR1 bit 1 also fails the scan compression aliasing to the pins is complete. There would be no pin fails. MISR fails would exist, but with no way to track which scan cycle if there are no other fails, or no clue that this even occurred if those MISRs fail in other scan cycles and do not alias. This is an existing limit to the compression scheme, that could be address with partial scans or is likely avoided by the same fail in a different test pattern, but this enhanced diagnostics will not further address.

It can be imagined that the actual versus expected MISR result could also be used to eliminate some of the detection flop options, thus faults needing simulation. However that calculation is much more complex and is likely much slower than just simulating the few cones that remain after the previously described optimization.

Figure 12:
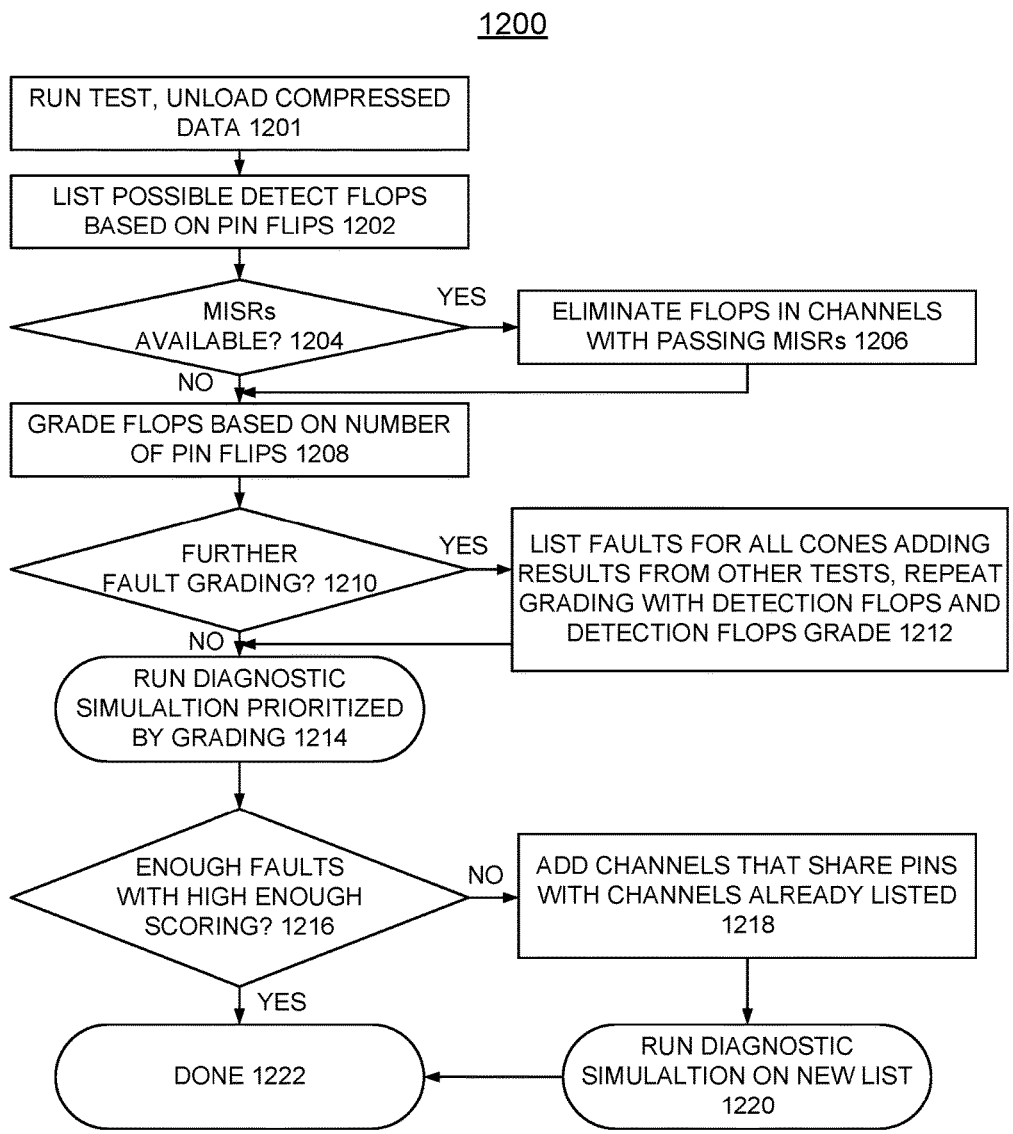
FIG. 12 is a flow chart illustrating example test operations in accordance with the preferred embodiments of the invention.

Referring now to FIG. 12, there is shown a flow chart illustrating example test operations generally designated by reference character 1200 in accordance with the preferred embodiments of the invention. The method of the invention provides for implementing enhanced scan data testing using an XOR network to prioritize faults to be simulated during diagnostic isolation, and then reducing the number of faults requiring re-simulation. As indicated at a block 1201, a test is run with scan data applied to scan channels using the XOR network and the output compressed scan data are unloaded. A list of possible faults is identified based on pin flips indicated at a block 1202. Checking whether MISRs are available is performed as indicated at a decision block 1204. When MISRs are available, flops in channels with passing MISRs are eliminated as indicated at a block 1206. As indicated at a block 1208, the flops are graded based on the number of pin flips. Checking is performed whether further fault grading is needed as indicated at a decision block 1210. The possible faults to be simulated during diagnostic isolation are prioritized by a number of occurrences in the list at block 1208, and possible faults optionally are further graded to reduce the number of possible faults requiring re-simulation as indicated at a block 1212. Diagnostic simulation is run prioritized by grading as indicated at a block 1214. Checking is performed whether enough faults with high enough scoring are identified as indicated at a decision block 1216. If not, then channels that share pins are added with channels already listed as indicated at a block 1218. Diagnostic simulation is run on the new list as indicated at a block 1220. When enough faults with high enough scoring are identified at decision block 1216, and after the diagnostic simulation on the new list is run at block 1220, the operations are complete as indicated at a block 1222.

Figure 13:
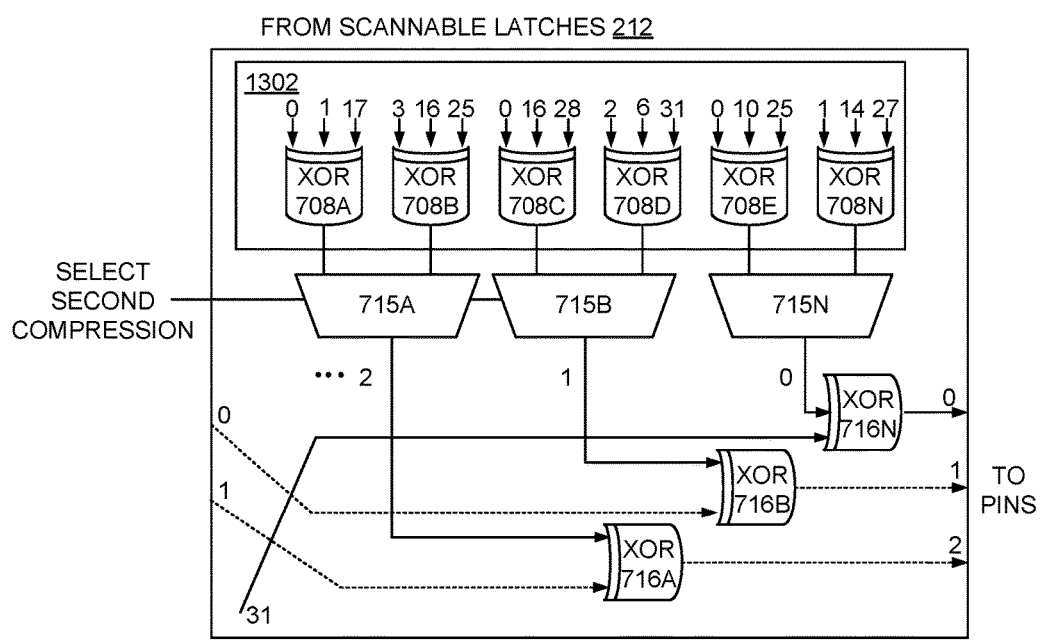
FIG. 13 illustrates an example circuit used for implementing enhanced scan testing in accordance with preferred embodiments of the invention.

Referring now to FIG. 13, there is shown an example circuit generally designated by reference character 1300 used for implementing enhanced scan testing in accordance with preferred embodiments of the invention. Circuit 1300 includes adding a secondary compression structure to the logic that allows collection of the same scan data in two different ways.

Circuit 1300 includes a first XOR 1302 including a plurality of XORs 708A, 708B, 708C, 708D, 708E, 708N, as shown, with the addition of a set of multiplexers (MUXes) 715A, 715B, 715N, each MUX having a control pin labeled SELECT SECOND COMPRESSION, and a second set of XORs including a plurality of XORs 716A, 716B, 708N for this function. While circuit 1300 will double the amount of data collected, circuit 1300 also provides a second view of the compressed failing bits. This will greatly reduce the aliasing due to multiple fails feeding common chip pins.

While running the same test twice and performing two separate compressed unloads might actually produce two different results with circuit 1300. This can be avoided by unloading the test for one test two ways by toggling the second compression select signal for every scan clock. As such the exact data is sampled twice, but each time using a different compression scheme. Data analysis is conducted using the same prioritization. While the table of possible failing location will almost double, the most likely failing locations will have an even greater weight so separate even better to the top of the list. Also, aliasing that made a fail disappear from the list would be extremely rare (probably non-existent), eliminating the need for the special analysis steps illustrated in FIGS. 10 and 11.

In brief summary, the primary goal of present invention is to increase the efficiency of diagnostic simulation. This is accomplished by both prioritizing faults to simulate based on affinity to the pins that reflect changes from expected results and eliminating faults that did not have an effect on the MISR that they ultimately feed.

Figure 14:
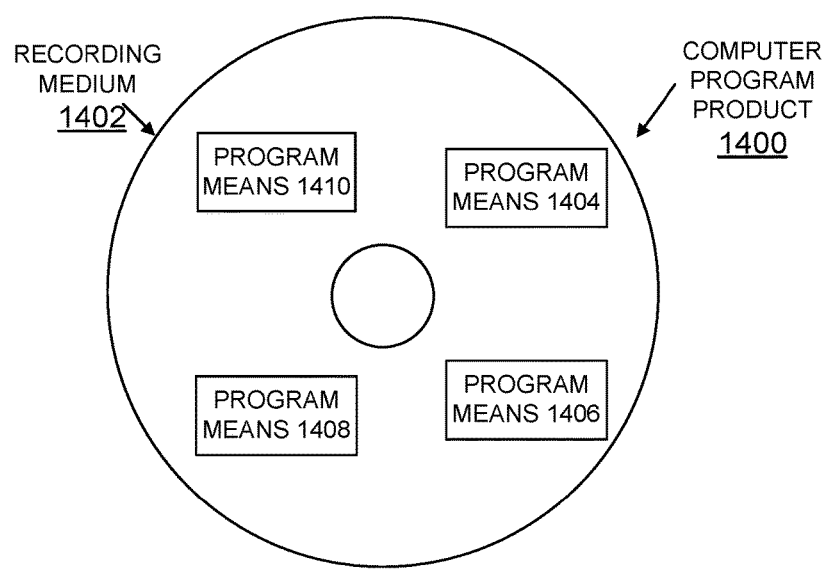
FIG. 14 is a block diagram illustrating a computer program product in accordance with the preferred embodiments.

Referring now to FIG. 14, an article of manufacture or a computer program product 1400 of the invention is illustrated. The computer program product 1400 includes a recording medium 1402, such as, a floppy disk, a high capacity read only memory in the form of an optically read compact disk or CD-ROM, a tape, or another similar computer program product. Recording medium 1402 stores program means 1404, 1406, 1408, and 1410 on the medium 1402 for carrying out the methods for implementing enhanced scan testing of the preferred embodiment in the system 100 of FIG. 1.

A sequence of program instructions or a logical assembly of one or more interrelated modules defined by the recorded program means 1404, 1406, 1408, and 1410, direct the computer system 100 for implementing enhanced scan testing of the preferred embodiment.

Figure 15:
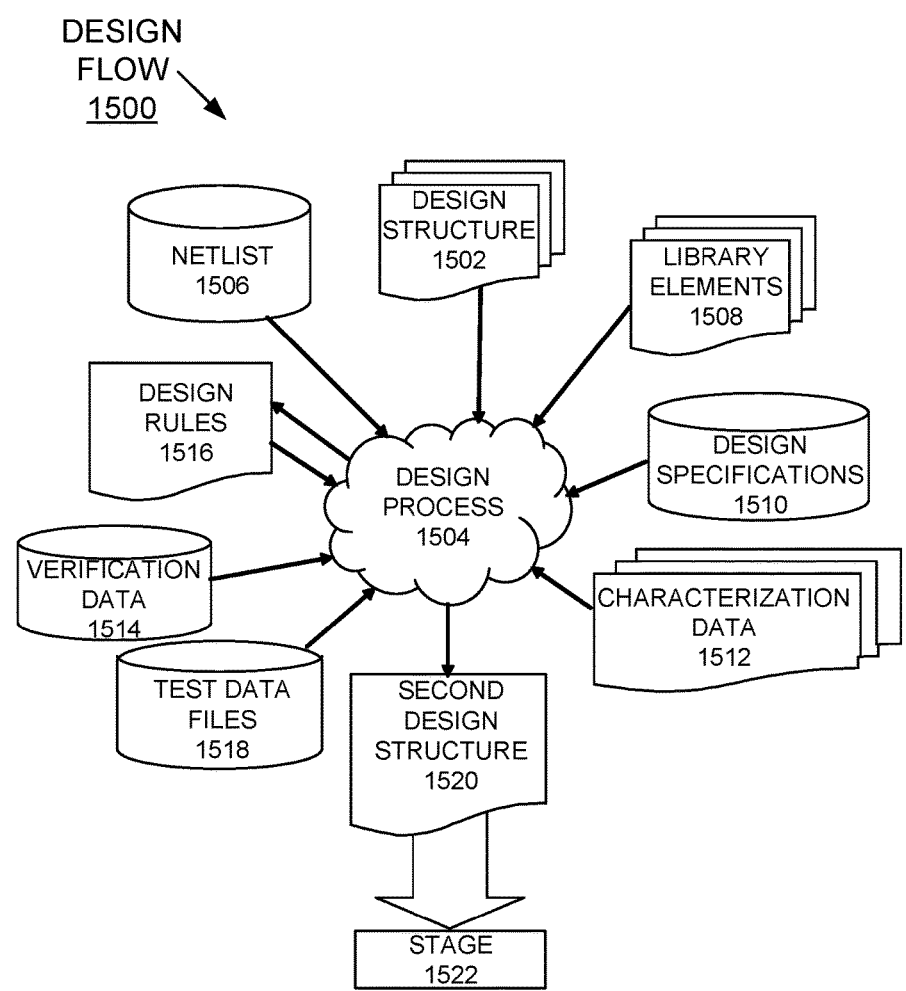
FIG. 15 is a flow diagram of a design process used in semiconductor design, manufacturing, and/or test.

FIG. 15 shows a block diagram of an example design flow 1500. Design flow 1500 may vary depending on the type of IC being designed. For example, a design flow 1500 for building an application specific IC (ASIC) may differ from a design flow 1500 for designing a standard component. Design structure 1502 is preferably an input to a design process 1504 and may come from an IP provider, a core developer, or other design company or may be generated by the operator of the design flow, or from other sources. Design structure 1502 comprises circuits 200, 250, 700, 800, 1300 in the form of schematics or HDL, a hardware-description language, for example, Verilog, VHDL, C, and the like. Design structure 1502 may be contained on one or more machine readable medium. For example, design structure 1502 may be a text file or a graphical representation of circuits 200, 250, 700, 800, 1300. Design process 1504 preferably synthesizes, or translates, circuits 200, 250, 700, 800, 1300 into a netlist 15015, where netlist 1506 is, for example, a list of wires, transistors, logic gates, control circuits, I/O, models, etc. that describes the connections to other elements and circuits in an integrated circuit design and recorded on at least one of machine readable medium. This may be an iterative process in which netlist 1506 is resynthesized one or more times depending on design specifications and parameters for the circuits.

Design process 1504 may include using a variety of inputs; for example, inputs from library elements 1508 which may house a set of commonly used elements, circuits, and devices, including models, layouts, and symbolic representations, for a given manufacturing technology, such as different technology nodes, design specifications 1510, characterization data 1512, verification data 1514, design rules 1516, and test data files 1518, which may include test patterns and other testing information. Design process 1504 may further include, for example, standard circuit design processes such as timing analysis, verification, design rule checking, place and route operations, and the like. One of ordinary skill in the art of integrated circuit design can appreciate the extent of possible electronic design automation tools and applications used in design process 1504 without deviating from the scope and spirit of the invention. The design structure of the invention is not limited to any specific design flow.

Design process 1504 preferably translates an embodiment of the invention as shown in FIGS. 2, 3, 7, 8 and 13 along with any additional integrated circuit design or data (if applicable), into a second design structure 1520. Design structure 1520 resides on a storage medium in a data format used for the exchange of layout data of integrated circuits, for example, information stored in a GDSII (GDS2), GL1, OASIS, or any other suitable format for storing such design structures. Design structure 1520 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2, 3, 7, 8 and 13. Design structure 1520 may then proceed to a stage 1522 where, for example, design structure 1520 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing enhanced scan data testing of a chip using an XOR network comprising:
   providing a first scan channel and a second scan channel;
   and said first scan channel and said second scan channel including a plurality of scannable latches providing input data to logic circuits on a chip and receiving output data from logic circuits on the chip;

providing the XOR network with a respective first exclusive or (XOR) for hashing output data from the scannable latches on the first scan channel and the second scan channel, and providing a respective second exclusive or (XOR) coupled to respective first exclusive or (XOR) on the first scan channel and the second scan channel to hash output data from the respective first exclusive or (XOR); said respective second exclusive OR (XOR) coupled to respective first exclusive or (XOR) on the first scan channel and the second scan channel for processing hashed output data of said respective first exclusive or (XOR) on the first scan channel and the second scan channel;

applying scan data to the first scan channel and the second scan channel using the XOR network and unloading output scan data to output pins;

identifying a list of possible faults based on pin state changes, prioritizing the possible faults by a number of occurrences in the list and running diagnostic simulation by prioritized possible faults during diagnostic isolation; and further grading the possible faults to reduce possible faults requiring simulation and running diagnostic simulation by prioritized possible faults by grading during diagnostic isolation.

2. The method as recited in claim 1 includes providing said respective first exclusive OR (XOR) and said respective second exclusive OR (XOR) on the first scan channel and the second scan channel including a plurality of parallel XORs functions.

3. The method as recited in claim 2 further includes providing a respective multiplexer and respective AND gates between said respective plurality of parallel XORs functions of said first exclusive or (XOR) and said respective plurality of parallel XORs functions of said second exclusive OR (XOR).

4. The method as recited in claim 1 wherein said respective multiplexer receiving data from said respective first exclusive or (XOR) and said respective second exclusive or (XOR) and coupled to a respective multiple input signature register (MISR).

5. The method as recited in claim 1 further includes providing a multiple input signature register (MISR) with an associated scan channel for MISR diagnostics.

6. The method as recited in claim 1 includes providing a multiplexer coupled to a multiple input signature register (MISR) and between a respective first exclusive or (XOR) and a respective second exclusive or (XOR) on a first scan channel and a second scan channel and applying a MISR unload input to a select input of the multiplexer.

7. The method as recited in claim 1 includes providing a first multiplexer receiving scan data from scan channels and coupled to a respective multiple input signature register (MISR) and a second multiplexer receiving output data from the respective MISR and applying a MISR unload input to a select input of the multiplexers.

8. A circuit for implementing enhanced scan data testing using an XOR network comprising:
a first scan channel and a second scan channel; and said first scan channel and said second scan channel including a plurality of scannable latches providing input data to logic circuits on a chip and receiving output data from logic circuits on the chip;
the XOR network including a respective first exclusive or (XOR) for hashing output data from the scannable latches on the first scan channel and the second scan channel, and a respective second exclusive or (XOR) coupled to respective first exclusive or (XOR) on the first scan channel and the second scan channel for processing hashed output data from the respective first exclusive or (XOR);
said respective first exclusive OR (XOR) and said respective second exclusive OR (XOR) on the first scan channel and the second scan channel including a plurality of parallel XORs functions;
a respective multiple input signature register (MISR) provided with the first scan channel and the second scan channel for MISR diagnostics; and
a respective multiplexer coupled to said respective multiple input signature register (MISR) and between a respective first exclusive or (XOR) and a respective second exclusive or (XOR) on the first scan channel and the second scan channel, and a MISR unload input to a select input of the multiplexer.

9. The circuit as recited in claim 8 includes a first multiplexer receiving scan data from scan channels and coupled to a respective multiple input signature register (MISR) and a second multiplexer receiving output data from the respective MISR, and a MISR unload input to a select input of the multiplexers.

10. The circuit as recited in claim 8 wherein the respective first exclusive or (XOR) includes a plurality of XOR functions, and wherein the respective second exclusive or (XOR) includes a plurality of XOR functions.

11. The circuit as recited in claim 10 includes a plurality of AND gates coupled between respective first XOR functions and a respective second XOR functions on the first scan channel and the second scan channel and said MISR unload input applied to an inverted input of the AND gates.

12. The circuit as recited in claim 10 includes a plurality of multiplexers coupled between respective first XOR functions and a respective second XOR functions on the first scan channel and the second scan channel and a select second compression input applied to a select input of the multiplexers.

13. A design structure tangibly embodied in a non-transitory machine readable medium for designing, manufacturing, and testing an integrated circuit, the design structure:
a circuit tangibly embodied in the non-transitory machine readable medium used in the design process, said circuit for implementing enhanced scan data testing using an XOR network, said circuit comprising:
a first scan channel and a second scan channel; and said first scan channel and said second scan channel including a plurality of scannable latches providing input data to logic circuits on a chip and receiving output data from logic circuits on the chip;
the XOR network including a respective first exclusive or (XOR) for hashing output data from the scannable latches on the first scan channel and the second scan channel, and a respective second exclusive or (XOR) coupled to respective first exclusive or (XOR) on the first scan channel and the second scan channel for processing hashed output data from the respective first exclusive or (XOR); said respective first exclusive OR (XOR) and said respective second exclusive OR (XOR) on the first scan channel and the second scan channel including a plurality of parallel XORs functions;
a respective multiple input signature register (MISR) provided with the first scan channel and the second scan channel for MISR diagnostics; and
a respective multiplexer coupled to said respective multiple input signature register (MISR) and between a respective first exclusive or (XOR) and a respective second exclusive or (XOR) on the first scan channel and the second scan channel, and a MISR unload input to a select input of the multiplexer, said design structure when read and used in the manufacture of a semiconductor chip produces a chip comprising said circuit.

14. The design structure of claim 13, wherein the design structure comprises a netlist, which describes said circuit.

15. The design structure of claim 13, wherein the design structure resides on storage medium as a data format used for the exchange of layout data of integrated circuits.

16. The design structure of claim 13, wherein the design structure includes at least one of test data files, characterization data, verification data, or design specifications.

17. The design structure of claim 13, wherein said circuit includes a first multiplexer receiving scan data from scan channels and coupled to a respective multiple input signature register (MISR) and a second multiplexer receiving output data from the respective MISR, and a MISR unload input to a select input of the multiplexers.

18. The design structure of claim 13, wherein the respective first exclusive or (XOR) includes a plurality of XOR functions, and wherein the respective second exclusive or (XOR) includes a plurality of XOR functions.

19. The design structure of claim 18, includes a plurality of AND gates coupled between respective first XOR functions and a respective second XOR functions on the first scan channel and the second scan channel and said MISR unload input applied to an inverted input of the AND gates.

20. The design structure of claim 18, includes a plurality of multiplexers coupled between respective first XOR functions and a respective second XOR functions on the first scan channel and the second scan channel and a select second compression input applied to a select input of the multiplexers.

* * * * *